(12) United States Patent
Yamada et al.

(10) Patent No.: US 8,729,567 B2
(45) Date of Patent: May 20, 2014

(54) SILICON CARBIDE SEMICONDUCTOR DEVICE

(71) Applicant: Sumitomo Electric Industries, Ltd., Osaka (JP)

(72) Inventors: Shunsuke Yamada, Osaka (JP); Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/895,910

(22) Filed: May 16, 2013

(65) Prior Publication Data

US 2013/0341647 A1 Dec. 26, 2013

Related U.S. Application Data (60) Provisional application No. 61/662,768, filed on Jun. 21, 2012.

(51) Int. Cl.
*H01L 29/15* (2006.01)
*H01L 31/0312* (2006.01)

(52) U.S. Cl.
USPC .......................................................... 257/77

(58) Field of Classification Search
CPC .............. H01L 29/66462; H01L 29/1608; H01L 29/1095; H01L 29/66666; H01L 29/665; H01L 29/7802; H01L 29/7827; H01L 2924/01013; H01L 29/45; H01L 29/66659; H01L 29/66712; H01L 21/0485; H01L 21/8213; H01L 21/8252; H01L 21/02378; H01L 21/02529; H01L 21/28575; H01L 21/3245; H01L 29/66272; H01L 29/66333; H01L 29/66363; H01L 29/73; H01L 29/7395; H01L 29/7783; H01L 29/7788; C30B 29/36

USPC ............... 257/77, 288, 901, 79, E29.297, 257/E29.298, E21.603, E21.605, E21.403, 257/E21.431–E21.435, E21.619–E21.62, 257/192, 194, 285, E29.246–E29.253, 257/E21.407, 20, 7, 93, 334, 368, 427, 444, 257/446, 491, 663, 713, E29.255–E29.313, 257/E29.315–E29.316, E21.409–E21.449, 257/E21.334–E21.346, E21.473, 135–136, 257/242, 329, E27.091, E27.095–E27.096, 257/E29.118, E29.274, E29.318, E29.262, 257/E27.052, E27.079, E29.036–E29.038, 257/E29.046–E29.048, E29.115, E29.196, 257/E29.211–E29.225, E21.388–E21.393, 257/E21.614, E21.677, 213–413, 900, 257/902–903, E21.21, E21.394, E21.458, 257/E21.615–E21.694; 438/285, 522, 167, 438/172, 135, 151, 197, 199, 201, 207, 216, 438/48–98, 46, 47, 102, 104, 188, 189, 438/603–604, 606, 930–933, 136, 137, 156, 438/173, 192, 206, 212

See application file for complete search history.

(56) References Cited

U.S. PATENT DOCUMENTS

| | | | |
|---|---|---|---|
| 2004/0183080 A1 | 9/2004 | Kusumoto et al. | |
| 2008/0230804 A1 | 9/2008 | Nishi et al. | |
| 2009/0321746 A1* | 12/2009 | Harada et al. | 257/77 |
| 2011/0031506 A1* | 2/2011 | Tamaso | 257/77 |
| 2012/0313112 A1* | 12/2012 | Wada et al. | 257/77 |
| 2012/0326167 A1* | 12/2012 | Tamaso | 257/77 |
| 2013/0062624 A1* | 3/2013 | Tsuchiya et al. | 257/77 |
| 2013/0234159 A1* | 9/2013 | Tsuchiya | 257/77 |
| 2013/0341647 A1* | 12/2013 | Yamada et al. | 257/77 |

FOREIGN PATENT DOCUMENTS

| | | |
|---|---|---|
| JP | 2004-304174 A | 10/2004 |
| JP | 2006-332199 A | 12/2006 |
| JP | 2008-235618 A | 10/2008 |
| WO | WO-2009/128419 A1 | 10/2009 |

OTHER PUBLICATIONS

International Search Report and Written Opinion in International Application No. PCT/JP2013/062210 dated Aug. 6, 2013.

Hiroyuki Matsunami et al., "Semiconductor SiC Technology and Application (Second Version)," Nikkan Kogyo Shimbunsha, Sep. 30, 2011, pp. 298-309.

* cited by examiner

*Primary Examiner* — Dao H Nguyen
*Assistant Examiner* — Tram H Nguyen
(74) *Attorney, Agent, or Firm* — Venable LLP; Micheal A. Sartori (57) ABSTRACT

A silicon carbide semiconductor device includes a silicon carbide substrate, and a contact electrode. The silicon carbide substrate includes an n type region and a p type region in contact with the n type region. The contact electrode forms contact with the silicon carbide substrate. The contact electrode includes a first region containing TiSi, and a second region containing Al. The first region includes an n contact region in contact with the n type region and a p contact region in contact with the p type region. The second region is formed to contact the p type region and the n type region, and to surround the p contact region and the n contact region. Accordingly, there can be provided a silicon carbide semiconductor device including an electrode allowing ohmic contact with both a p type impurity region and an n type impurity region formed at a silicon carbide substrate.

6 Claims, 6 Drawing Sheets

SILICON CARBIDE SEMICONDUCTOR DEVICE

BACKGROUND OF THE INVENTION

1. Field of the Invention

The present invention relates to a silicon carbide semiconductor device, more particularly, a silicon carbide semiconductor device having a contact electrode in contact with a silicon carbide substrate.

2. Description of the Background Art

In recent years, silicon carbide substrates are now being used for manufacturing semiconductor devices. Silicon carbide has a bandgap larger than that of silicon. Therefore, a semiconductor device employing a silicon carbide substrate advantageously has a high breakdown voltage, low ON resistance, and less property deterioration in a high temperature environment.

As a method of forming an ohmic electrode for silicon carbide, metal material including Ni or Al is vapor-deposited on an impurity region doped at high concentration. Then, the metal material is subjected to rapid thermal treatment at the temperature of approximately 1000° C. to form a reaction layer. Thus, ohmic contact is established between the reaction layer and silicon carbide (refer to Hiroyuki Matsunami et al. "Semiconductor SiC Technology and Application (Second Version)", Nikkan Kogyo Shimbunsha, Sep. 30, 2011, pp. 298-309)

Although Ni allows ohmic contact with an n type impurity region formed at a silicon carbide substrate, Ni exhibits high contact resistance to a p type impurity region formed at the silicon carbide substrate. In contrast, Al allows ohmic contact with a p type impurity region formed at a silicon carbide substrate while exhibiting high contact resistance with an n type impurity region formed at the silicon carbide substrate. It was therefore extremely difficult to realize ohmic contact for both a p type impurity region and an n type impurity region formed at a silicon carbide substrate.

SUMMARY OF THE INVENTION

An object of the present invention is to provide a silicon carbide semiconductor device having an electrode capable of ohmic contact with both a p type impurity region and an n type impurity region formed at a silicon carbide substrate.

A silicon carbide semiconductor device according to the present invention includes a silicon carbide substrate, and a contact electrode. The silicon carbide substrate includes an n type region and a p type region in contact with the n type region. The contact electrode forms contact with the silicon carbide substrate. The contact electrode includes a first region containing TiSi, and a second region containing Al. The first region includes an n contact region in contact with the n type region, and a p contact region in contact with the p type region. The second region is formed in contact with the p type region and the n type region, and to surround the p contact region and the n contact region.

As used herein, TiSi refers to a compound having Ti—Si bonding, and includes those with a Ti and Si composition ratio besides 1:1.

According to the silicon carbide semiconductor device of the present invention, ohmic contact is allowed at a first region containing TiSi and an n type region, and at a second region containing Al and a p type region. As a result, ohmic contact can be established for both an n type region and a p type region.

Preferably in the foregoing silicon carbide semiconductor device, the contact electrode includes a region where the number of carbon atoms is larger than the number of silicon atoms.

Accordingly, low contact resistance can be realized, as compared to a contact electrode not including a region where the number of carbon atoms is larger than the number of silicon atoms.

Preferably in the foregoing silicon carbide semiconductor device, the second region is formed to cover the p contact region and the n contact region. Accordingly, the area of the second region facing a protection electrode is increased, allowing the adherence with the protection electrode to be improved.

Preferably in the foregoing silicon carbide semiconductor device, when the number of Ti atoms is x, the number of Al atoms is y, and the number of Si atoms is z in the contact electrode, the ratio of two arbitrary number of atoms from x, y and z is greater than or equal to 1/3 and less than or equal to 3. Accordingly, favorable ohmic contact can be realized for both an n type region and p type region.

Preferably in the foregoing silicon carbide semiconductor device, the width of each of the p contact region and the n contact region in a direction parallel to the main face of the silicon carbide substrate is less than or equal to 500 nm. Accordingly, favorable ohmic contact can be realized for both an n type region and p type region.

Preferably in the foregoing silicon carbide semiconductor device, the contact electrode further includes a third region containing TiC. As used herein, TiC refers to a compound having Ti—C bonding, and includes those with a Ti and C composition ratio besides 1:1. Accordingly, favorable ohmic contact with both an n type region and p type region can be realized.

As apparent from the foregoing, a silicon carbide semiconductor device having an electrode capable of ohmic contact with both a p type impurity region and an n type impurity region formed at a silicon carbide substrate can be provided by the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings. In the drawings, the same or corresponding elements have the same reference characters allotted, and description thereof will not be repeated.

First, a configuration of an MOSFET 1 (Metal Oxide Semiconductor Field Effect Transistor) as a silicon carbide semiconductor device according to an embodiment of the present invention will be described.

Figure 1:
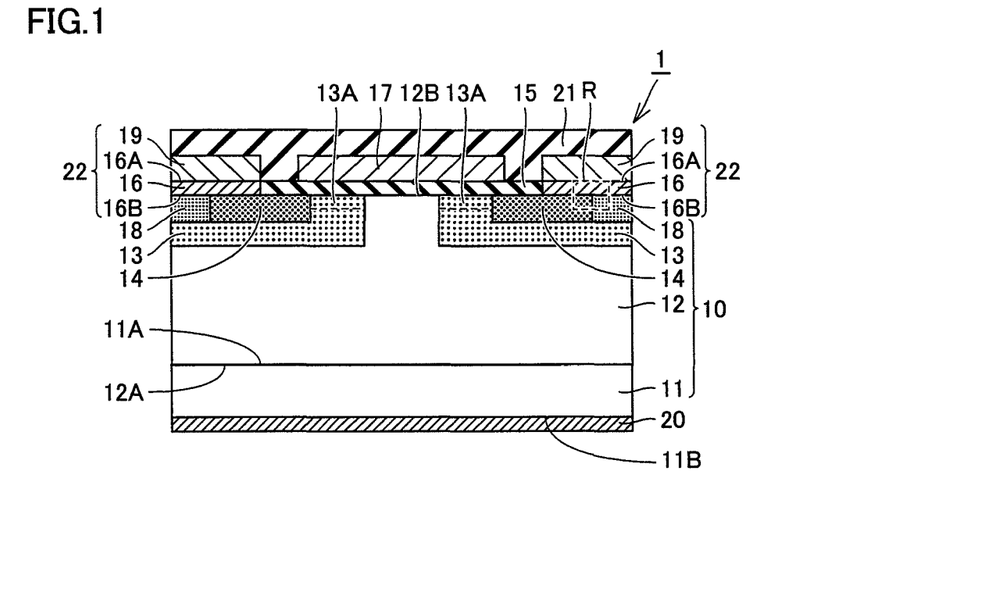
FIG. 1 is a sectional view schematically representing a configuration of a silicon carbide semiconductor device according to an embodiment of the present invention.

Referring to FIG. 1, MOSFET 1 includes a silicon carbide substrate 10. Silicon carbide substrate 10 includes an $n^+$ substrate 11, an $n^-$ SiC layer 12, a p body 13, an $n^+$ source region 14, and a $p^+$ region 18.

$N^+$ substrate 11 is a substrate of n conductivity type, formed of silicon carbide (SiC). $N^+$ substrate 11 includes n type impurities of high concentration (impurities of n conductivity type), for example N (nitrogen).

$N^-$ SiC layer 12 is a semiconductor layer of n conductivity type, formed of SiC. $N^-$ SiC layer 12 is formed on one main face 11A of $n^+$ substrate 11 to a thickness of approximately 10 μm, for example. The n type impurities in $n^-$ SiC layer 12 are N (nitrogen), for example, and present at a concentration lower than that of the n type impurities in $n^+$ substrate 11, for example, present at the concentration of $5 \times 10^{15}$ cm$^{-3}$.

A pair of p bodies 13 has p type conductivity. Each of p bodies 13 constituting a pair is formed separated from the other so as to include a second main face 12B (substrate face) that is the main face at a side opposite to a first main face 12A that is the main face at the side of $n^+$ substrate 11 in $n^-$ SiC layer 12. The p type impurities in p body 13 are Al (aluminium), B (boron), or the like. The p type impurities are present at a concentration lower than that of n type impurities included in $n^+$ substrate 11, for example, present at the concentration of $1 \times 10^{17}$ cm$^3$.

$N^+$ source region 14 is an n type region having n type conductivity. $N^+$ source region 14 is formed in each of p bodies 13 constituting a pair so as to include a second main face 12B and surround p body 13. $N^+$ source region 14 includes n type impurities, for example P (phosphorus), at a concentration higher than that of the n type impurities in $n^-$ SiC layer 12, for example, at the concentration of $1 \times 10^{20}$ cm$^{-3}$.

$P^+$ region 18 is a p type region having p type conductivity. $P^+$ region 18 is formed to include, when viewed from $n^+$ source region 14 formed in one of p bodies 13 constituting a pair, second main face 12B, at the side opposite to $n^+$ source region 14 formed in the other p body 13. $P^+$ region 18 includes p type impurities, for example Al, B or the like, at a concentration higher than that of the p type impurities included in p body 13, for example at the concentration of $1 \times 10^{20}$ cm$^{-3}$.

MOSFET 1 includes a gate oxide film 15 (insulation film) as a gate insulation film, a gate electrode 17, a pair of contact electrodes 16 (source contact electrode), a protection electrode 19, a drain electrode 20 and a passivation film 21.

Gate oxide film 15 is formed in contact with and on second main face 12B of $n^-$ SiC layer 12 so as to extend from the top surface of one $n^+$ source region 14 to the top surface of the other $n^-$ source region 14. Gate oxide film 15 preferably includes at least any of a silicon oxide film and silicon nitride film, and is formed of silicon dioxide (SiO$_2$), for example.

Gate electrode 17 is arranged in contact with gate oxide film 15, so as to extend on and from one $n^+$ source region 14 to the other $n^+$ source region 14. Gate electrode 17 is formed of a conductor such as of polysilicon, Al, or the like.

Contact electrode 16 is arranged to extend from above each of $n^+$ source regions 14 constituting a pair as far as above $p^+$ region 18 in the direction away from gate oxide film 15, and is in contact with second main face 12B. Details of the configuration of contact electrode 16 will be described afterwards.

Protection electrode 19 is formed in contact with contact electrode 16, and made of a conductor such as of Al. Protection electrode 19 is electrically connected with $n^+$ source region 14 via contact electrode 16. Protection electrode 19 and contact electrode 16 constitute a source electrode 22.

Drain electrode 20 is formed in contact with the other main face 11B that is the main face at the side opposite to one main face 11A that is the main face at the side where $n^-$ SiC layer 12 is formed at $n^+$ substrate 11. Drain electrode 20 may have a structure similar to that of contact electrode 16 set forth above, for example, or may be formed of another material allowing ohmic contact with $n^+$ substrate 11, such as Ni (nickel). Accordingly, drain electrode 20 is electrically connected with $n^+$ substrate 11.

Passivation film 21 is formed to pass over gate electrode 17, extending from above one protection electrode 19 to above the other protection electrode 19. Passivation film 21 is formed of SiO$_2$, for example, and functions to electrically insulate protection electrode 19 and gate electrode 17 from outside, and to protect MOSFET 1.

The configuration of a region R of MOSFET 1 in FIG. 1 will be described in detail with reference to FIGS. 2-5.

Figure 2:
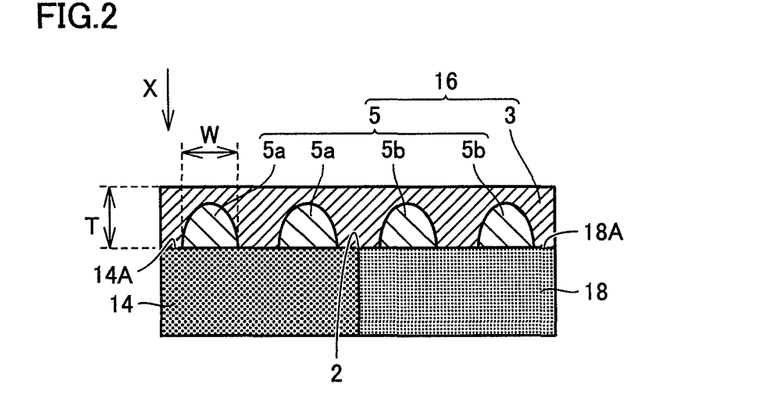
FIG. 2 is an enlarged sectional view of a region R of FIG. 1.

Referring to FIG. 2, region R includes $n^+$ source region 14, $p^+$ region 18, and contact electrode 16. $P^+$ region 18 forms contact with $n^+$ source region 14. Contact electrode 16 includes a first region 5 containing TiSi, and a second region 3 containing Al. First region 5 includes an n contact region 5a in contact with $n^+$ source region 14 at main face 14A, and a p contact region 5b in contact with $p^+$ region 18 at main face 18A. Second region 3 is formed to contact $n^+$ source region 14 and $p^-$ region 18, and to surround p contact region 5b and n contact region 5a.

Second region 3 may include a compound having Al—O bonding. Further, contact electrode 16 may contain carbon. First region 5 and second region 3 may also contain carbon.

As shown in FIG. 2, second region 3 may be formed to have a thickness greater than the thickness of first region 5, and to cover first region 5. P contact region 5b is arranged as an island on main face 18A of $p^+$ region 18, for example. N contact region 5a is arranged as an island on main face 14A of $n^+$ source region 14, for example. The width W of each of p contact region 5b and n contact region 5a (specifically, the width of p contact region 5b and n contact region 5a in the direction parallel to second main face 12B of silicon carbide substrate 10. Preferably, width W is greater than or equal to 10 nm and less than or equal to 100 nm, more preferably greater than or equal to 30 nm and less than or equal to 60 nm. The widths of $n^+$ source region 14 and $p^+$ region 18 are approximately 3.2 μm and approximately 1.8 μm, respectively. The thickness T of contact electrode 16 is, for example, approximately 100 nm. FIG. 2 is a sectional view taken along line II-II of FIG. 3.

Figure 3:
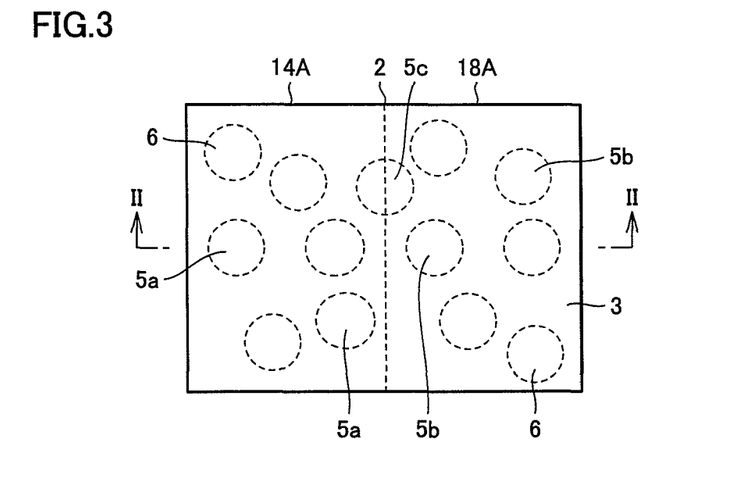
FIG. 3 is an enlarged plan view of a region R of FIG. 1.

FIG. 3 is a plan view of region R shown in FIG. 2, viewed from above the drawing sheet (the direction of arrow X). As shown in FIG. 3, a plurality of n contact regions 5a are arranged in a mottled manner on main face 14A, of $n^+$ source region 14. Further, a plurality of p contact regions 5b are arranged in a mottled manner on main face 18A of $p^+$ region 18. $N^+$ source region 14 forms contact with $p^+$ region 18 at a border 2. First region 5 may have, at border 2, a first pn contact region 5c in contact with both $n^+$ source region 14 and $p^+$ region 18. Further, contact electrode 16 may include a third region 6 containing TiC. P contact region 5b, n contact region 5a, first pn contact region 5c and third region 6 have substantially a circle shape, for example, in plan view.

Figure 4:
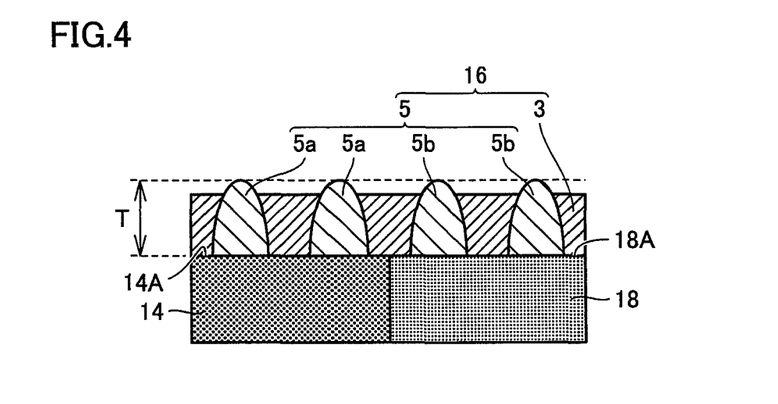
FIG. 4 is an enlarged sectional view of a region R of FIG. 1.

Referring to FIG. 4, the height of first region 5 may be larger than the height of second region 3. In this case, the top of second region 3 is arranged to protrude from the first region. Second region 3 is formed to surround first region 5 in plan view.

Figure 5:
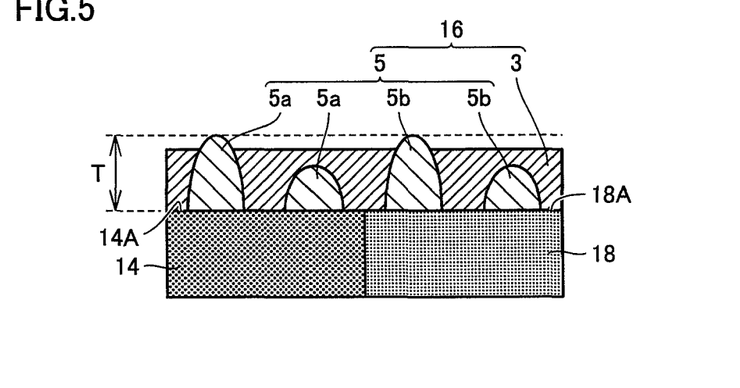
FIG. 5 is an enlarged sectional view of a region R of FIG. 1.

Referring to FIG. 5, the height of the plurality of first regions 5 may differ from each other. Among the plurality of first regions 5, the height of one first region 5 may be larger than the height of second region 3, and the height of another first region 5 may be smaller than the height of the second region. Specifically, a plurality of p contact regions 5b may include a p contact region 5b higher than second region 3, and a p contact region 5b lower than second region 3. Similarly, a plurality of n contact regions 5a may include an n contact region 5a higher than second region 3, and an n contact region 5a lower than second region 3. Second region 3 is formed to surround first region 5 in plan view.

Figure 12:
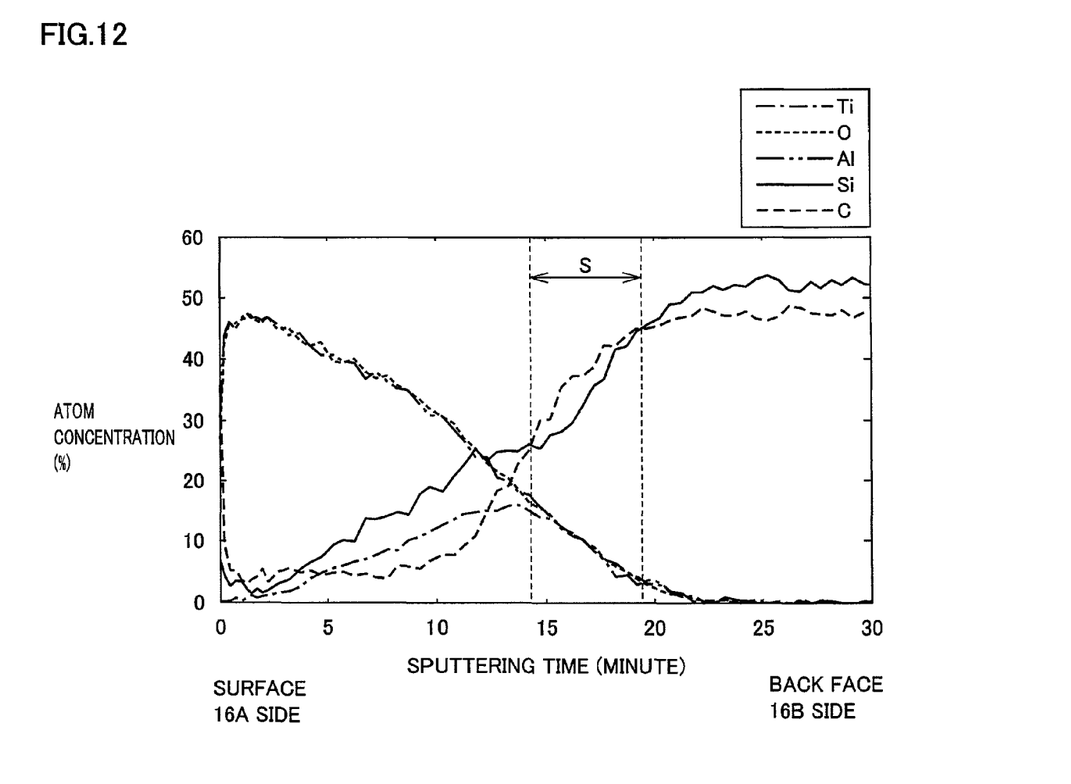
FIG. 12 is a diagram representing the atom concentration in a contact electrode of a silicon carbide semiconductor device according to an embodiment of the present invention.

Referring to FIG. 12, the distribution of atom concentration in contact electrode 16 will be described hereinafter. In FIG. 12, the left side corresponds to the side of protection electrode 19 (in other words, the side of surface 16A of contact electrode 16), whereas the right side corresponds to the side of silicon carbide substrate 10 (in other words, the side of back face 16B of the contact electrode). Upon analyzing the concentration of atoms constituting contact electrode 16 by Auger electron spectroscopy, for example, there are more Al (aluminium) and O (oxygen) than Si (silicon) and C (carbon) at the side of surface 16A of contact electrode 16. However, at the side of back face 16B of contact electrode 16, there are more Si and C than Al and O.

Preferably, at the side of back face 16B of contact electrode 16, there is a region S where the number of C (carbon) atoms is larger than the number of Si (silicon) atoms. Contact electrode 16 having region S where the number of C (carbon) atoms is larger than the number of Si (silicon) atoms exhibits a lower contact resistance than contact electrode 16 absent of region S where the number of C (carbon) atoms is larger than the number of Si (silicon) atoms.

Preferably, when the number of Ti (titanium) atoms is x, the number of Al (aluminium) atoms is y, and the number of Si (silicon) atoms is z, the ratio of two arbitrary number of atoms from x, y and z is greater than or equal to 1/3 and less than or equal to 3. In other words, the number of atoms with a higher count divided by the number of atoms with a lower count is less than or equal to 3, whereas the number of atoms with a lower count divided by the number of atoms with a higher count is greater than or equal to 1/3. For example, the number of Ti atoms is greater than or equal to 1/3 times and less than or equal to 3 times the number of Si atoms, the number of Si atoms is greater than or equal to 1/3 times and less than or equal to 3 times the number of Al atoms, and the number of Al atoms is greater than or equal to 1/3 times and less than or equal to 3 times the number of Ti atoms.

The operation of MOSFET 1 will be described hereinafter. Under the state where a voltage less than or equal to a threshold value is applied to gate electrode 17, i.e. in an OFF state, reverse bias is established between p body 13 located immediately beneath gate oxide film 15 and $n^-$ SiC layer 12, leading to a non-conductive state. When positive voltage is applied to gate electrode 17, an inversion layer is formed at a channel region 13A that is a region of p body 13 in the neighborhood of gate oxide film 15 forming contact therewith. As a result, $n^+$ source region 14 and $n^-$ SiC layer 12 are electrically connected, whereby current flows between source electrode 22 and drain electrode 20.

A method for manufacturing MOSFET 1 as a silicon carbide semiconductor device according to the first embodiment will be described hereinafter.

Figure 6:
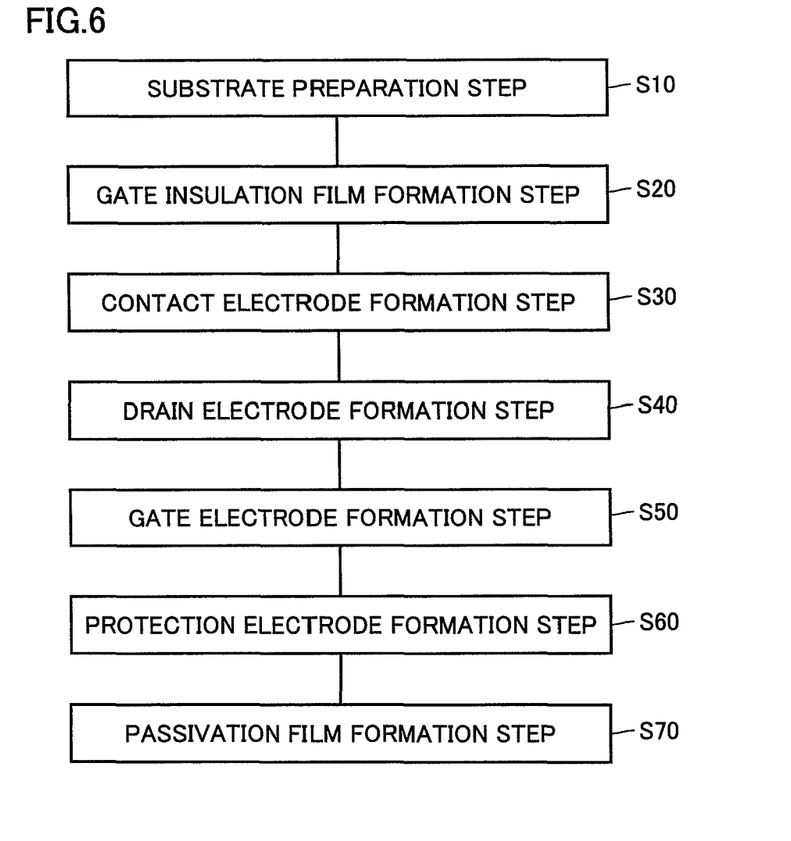
FIG. 6 is a flowchart schematically representing a method for manufacturing a silicon carbide semiconductor device according to an embodiment of the present invention.
Figure 7:
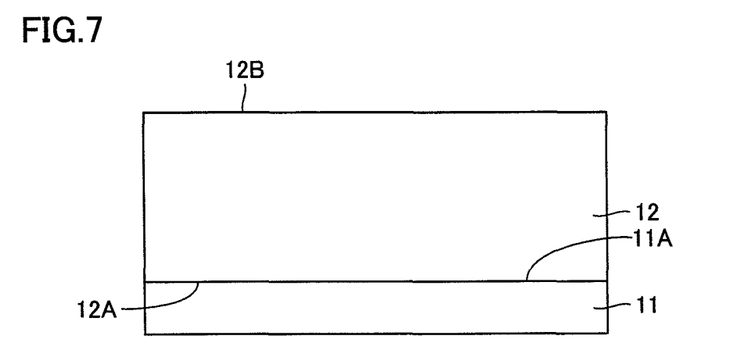
FIG. 7 is a sectional view schematically representing a first step in a method for manufacturing a silicon carbide semiconductor device according to an embodiment of the present invention.
Figure 8:
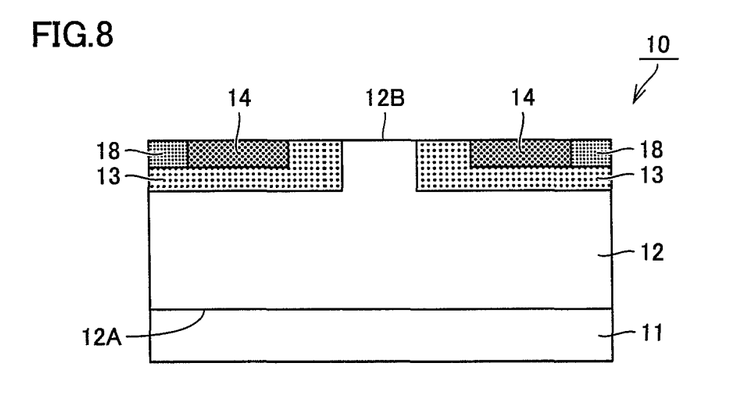
FIG. 8 is a sectional view schematically representing a second step in a method for manufacturing a silicon carbide semiconductor device according to an embodiment of the present invention.

Referring to FIGS. 7 and 8, a silicon carbide substrate 10 is prepared by a substrate preparation step S10 (FIG. 6).

Specifically, by epitaxial-growth on $n^+$ SiC substrate 11, $n^-$ SiC layer 12 is formed on one main face 11A of $n^+$ SiC substrate 11. Epitaxial-growth can be implemented by employing a mixture gas of $SiH_4$ (silane) and $C_3H_8$ (propane) as the raw material gas. At this stage, N (nitrogen), for example, is introduced as the n type impurities. Accordingly, there can be formed an $n^-$ SiC layer 12 including n type impurities at a concentration lower than that of the n type impurities present in $n^+$ SiC substrate 11.

Then, on second main face 12B, an oxide film such as of $SiO_2$ is formed by CVD (Chemical Vapor Deposition), for example. Following application of a resist on the oxide film, exposure and development are carried out to form a resist film having an opening at a region corresponding to the desired shape of p body 13. Using the resist film as a mask, the oxide film is partially removed by RIE (Reactive Ion Etching), for example, to form a mask layer consisting of an oxide film having an opening pattern on $n^-$ SiC layer 12. Then, upon removing the resist film, p type impurities such as Al are ion-implanted into $n^-$ SiC layer 12 using the mask layer as a mask to form p body 13 at $n^-$ SiC layer 12.

Then, upon removing the aforementioned oxide film used as a mask, a mask layer having an opening at a region corresponding to the desired shape of $n^+$ source region 14 is formed. Using this mask layer as a mask, n type impurities such as P (phosphorus) are introduced by ion implantation to $n^-$ SiC layer 12 to form $n^+$ source region 14. Then, a mask layer having an opening at a region corresponding to the desired shape of $p^+$ region 18 is formed. Using this as a mask, p type impurities such as Al or B are introduced by ion implantation into $n^-$ SiC layer 12 to form $p^+$ region 18.

Then, a heat treatment to render active the impurities introduced by ion implantation is carried out. Specifically, $n^-$ SiC layer 12 subjected to ion implantation is heated to approximately 1700° C. in an atmosphere of Ar (argon) for example, and maintained for approximately 30 minutes. Thus, silicon carbide substrate 10 having second main face 12B (FIG. 8) is prepared.

Figure 9:
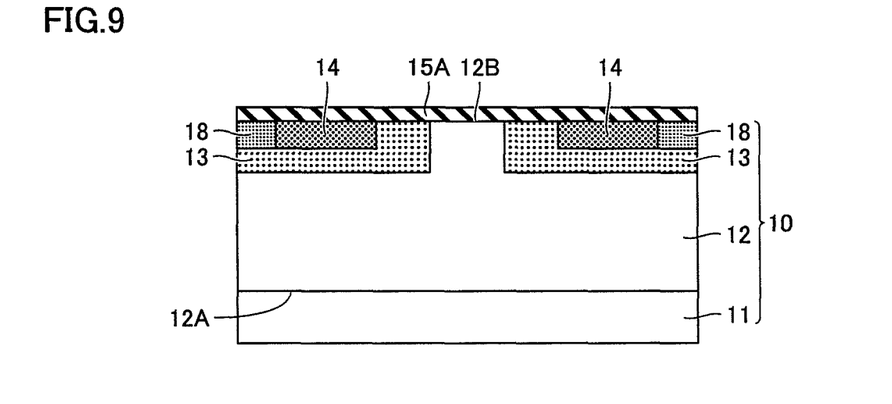
FIG. 9 is a sectional view schematically representing a third step in a method for manufacturing a silicon carbide semiconductor device according to an embodiment of the present invention.

Referring to FIG. 9, gate oxide film 15 (insulation film) is formed by a gate insulation film formation step S20 (FIG. 6).

Specifically, an n+ substrate 11 formed with n− SiC layer 12 subjected to the foregoing step to include a desired ion implantation region is thermally oxidized. Thermal oxidation can be implemented by, for example, heating in an oxygen atmosphere at approximately 1300° C., maintained for approximately 40 minutes. Accordingly, a thermal oxidation film 15A (having a thickness of approximately 50 nm, for example) made of silicon dioxide ($SiO_2$) is formed on second main face 12B.

Following application of a resist on thermal oxidation film 15A, exposure and development are carried out to form a resist film having an opening corresponding to a region where contact electrode 16 (refer to FIG. 1) is to be formed. Then, using the resist film as a mask, the thermal oxidation film is removed partially by RIE, for example. Thus, gate oxide film 15 partially covering second main face 12B is formed.

Figure 10:
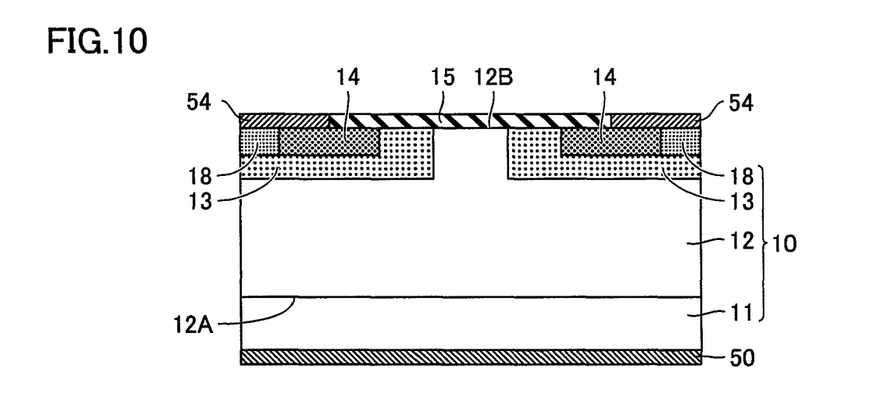
FIG. 10 is a sectional view schematically representing a fourth step in a method for manufacturing a silicon carbide semiconductor device according to an embodiment of the present invention.

Referring to FIG. 10, a contact electrode formation step S30 (FIG. 6) is carried out.

Specifically, a metal layer 54 having a Ti portion, an Al portion, and a Si portion sequentially stacked on silicon carbide substrate 10 is formed on n+ source region 14 and p+ region 18. The thickness of the Ti portion, Al portion, and Si portion is, for example, 250 Å, 200 Å and 300 Å, respectively. The thickness of metal layer 54 is preferably less than or equal to 1 μm, more preferably less than or equal to 500 nm, and further preferably less than or equal to 100 nm. A thinner metal layer 54 facilitates alloying. Preferably, metal layer 54 is formed by sputtering or vapor deposition.

Further, metal layer 54 may have the Ti portion, Al portion, and Si portion take a juxtaposed structure aligned in a direction parallel to second main face 12B of silicon carbide substrate 10, or a structure aligned in a grid. Moreover, metal layer 54 may be a composite film having the Ti portion, Al portion, and Si portion mixed.

Then, the resist film is removed to eliminate (lift off) metal layer 54 on the resist film, leaving the region of metal layer 54 in contact with n+ source region 14 and p+ region 18.

Figure 11:
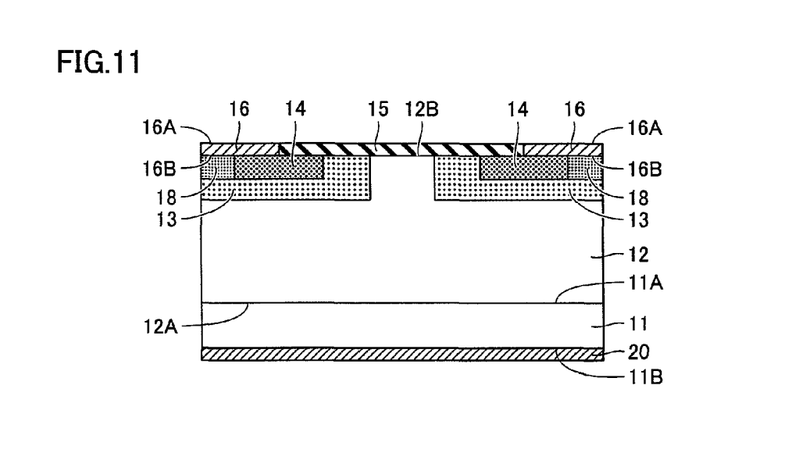
FIG. 11 is a sectional view schematically representing a fifth step in a method for manufacturing a silicon carbide semiconductor device according to an embodiment of the present invention.

Referring to FIG. 11 following formation of metal layer 54, an annealing step is carried out. Metal layer 54 is alloyed by heating to form contact electrode 16 in ohmic contact with silicon carbide substrate 10. Specifically, in an inert gas atmosphere such as Ar, metal layer 54 and silicon carbide substrate 10 are heated to a temperature greater than or equal to 950° C. and less than or equal to 1200° C., for example to 1000° C., and maintained for a period greater than or equal to 30 seconds and less than or equal to 300 seconds, for example. Accordingly, the Ti and Si contained in metal layer 54 are aggregated in the shape of an island to form first region 5 containing TiSi. In addition, Al spreads so as to surround the first layer, forming second region 3 containing Al. Thus, contact electrode 16 is obtained, having first region 5 containing TiSi and second region 3 containing Al formed in a mottled manner. In order to form a contact electrode 16 having such a configuration, the annealing time is preferably lengthened. For example, metal layer 54 and silicon carbide substrate 10 are heated at a temperature greater than or equal to 950° C. and less than or equal to 1200° C., for example at 1000° C., and maintained for a period greater than or equal to 120 seconds and less than or equal to 150 seconds, for example.

Then, by a drain electrode formation step S40 (FIG. 6), drain electrode 20 is formed at a face opposite to second main face 12B of silicon carbide substrate 10. For example, Ni is sputtered on to form a Ni layer at the opposite side face. The Ni layer is annealed to form drain electrode 20. Metal layer 54 set forth above may be employed instead of this Ni layer.

Referring to FIG. 1 again, a gate electrode formation step S50 (FIG. 6) is carried out to form a gate electrode 17. In this step, gate electrode 17 that is a conductor such as of polysilicon, Al, or the like is formed to extend from above one n+ source region 14 to above the other n+ source region 14, and in contact with gate oxide film 15. In the case where polysilicon is employed as the material of the gate electrode, the polysilicon may include P (phosphorus) at a high concentration exceeding $1 \times 10^{20}$ $cm^{-3}$.

Next, at a protection electrode formation step S60 (FIG. 6), protection electrode 19 is formed. By vapor deposition, for example, protection electrode 19 that is a conductor of Al is formed on surface 16A of contact electrode 16. Thus, source electrode 22 is completed.

At the next passivation film formation step S70 (FIG. 6), passivation film 21 is formed. In this step, passivation film 21 such as of $SiO_2$, for example, is formed to pass over gate electrode 17, extending from above one protection electrode 19 to above the other protection electrode 19. Passivation film 21 can be formed by CVD, for example. Accordingly, MOSFET 1 is completed.

A configuration in which the n type and p type in the foregoing embodiment are exchanged may be employed. Furthermore, the description is based on, but not limited to a planar type MOSFET as an example of a silicon carbide semiconductor device of the present invention. For example, the silicon carbide semiconductor device may be a trench type MOSFET, an IGBT (Insulated Gate Bipolar Transistor), or the like.

The functional effect of the present embodiment will be described hereinafter.

According to MOSFET 1 of the present embodiment, n contact region 5a containing TiSi is brought into contact with n+ source region 14, whereas second region 3 containing Al is brought into contact with p+ region 18. Accordingly, ohmic contact is allowed between n contact region 5a containing TiSi and n+ source region 14 as well as between second region 3 containing Al and p+ region 18. As a result, ohmic contact can be realized for both n+ source region 14 and p+ region 18.

According to MOSFET 1 of the present embodiment, contact electrode 16 includes a region where the number of carbon atoms is larger than the number of silicon atoms. Accordingly, a low contact resistance can be realized as compared to a contact electrode 16 absent of a region where the number of carbon atoms is larger than the number of silicon atoms.

Furthermore, according to MOSFET 1 of the present embodiment, second region 3 is formed to cover p contact region 5b and n contact region 5a. Therefore, the area of second region 3 facing protection electrode 19 becomes larger, allowing the adherence with protection electrode 19 to be improved.

Further, according to MOSFET 1 of the present embodiment, when the number of Ti atoms is x, the number of Al atoms is y, and the number of Si atoms is z in contact electrode 16, the ratio of two arbitrary number of atoms from x, y and z is greater than or equal to 1/3 and less than or equal to 3. Accordingly, favorable ohmic contact can be realized for both an n type region and a p type region.

Furthermore, according to MOSFET 1 of the present embodiment, the width W of each of p contact region 5b and n contact region 5a in a direction parallel to second main face 12B of silicon carbide substrate 10 is less than or equal to 500 nm. Accordingly, favorable ohmic contact can be realized for both n+ source region 14 and p+ region 18.

Moreover, according to MOSFET 1 of the present embodiment, contact electrode 16 further includes third region 6 containing TiC. Therefore, favorable ohmic contact can be realized for both n⁺ source region 14 and p⁺ region 18.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
   a silicon carbide substrate including an n type region and a p type region in contact with said n type region, and
   a contact electrode in contact with said silicon carbide substrate,
   said contact electrode including a first region containing TiSi and a second region containing Al,
   said first region including an n contact region in contact with said n type region and a p contact region in contact with said p type region,
   said second region formed in contact with said p type region and said n type region, and surrounding said p contact region and said n contact region.

2. The silicon carbide semiconductor device according to claim 1, wherein said contact electrode includes a region where the number of carbon atoms is larger than the number of silicon atoms.

3. The silicon carbide semiconductor device according to claim 1, wherein said second region is formed to cover said p contact region and said n contact region.

4. The silicon carbide semiconductor device according to claim 1, wherein, when the number of Ti atoms is x, the number of Al atoms is y, and the number of Si atoms is z in said contact electrode, a ratio of two arbitrary number of atoms from x, y and z is greater than or equal to 1/3 and less than or equal to 3.

5. The silicon carbide semiconductor device according to claim 1, wherein a width of each of said p contact region and said n contact region in a direction parallel to a main face of said silicon carbide substrate is less than or equal to 500 nm.

6. The silicon carbide semiconductor device according to claim 1, wherein said contact electrode further includes a third region containing TiC.

* * * * *